(12) United States Patent
Brodoceanu et al.

(10) Patent No.: US 11,101,159 B1
(45) Date of Patent: Aug. 24, 2021

(54) PICKUP HEAD WITH PHOTOCURABLE POLYMERS FOR ASSEMBLING LIGHT EMITTING DIODES

(71) Applicant: Facebook Technologies, LLC, Menlo Park, CA (US)

(72) Inventors: Daniel Brodoceanu, Cork (IE); Oscar Torrents Abad, Cork (IE); Ali Sengül, Zurich (CH); Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 31 days.

(21) Appl. No.: 16/732,704

(22) Filed: Jan. 2, 2020

Related U.S. Application Data (60) Provisional application No. 62/892,418, filed on Aug. 27, 2019.

(51) Int. Cl.
| | |
|---|---|
| *H01L 21/683* | (2006.01) |
| *H01L 21/67* | (2006.01) |
| *H01L 25/075* | (2006.01) |
| *H01L 33/24* | (2010.01) |
| *H01L 33/44* | (2010.01) |
| *H01L 33/40* | (2010.01) |
| *H01L 33/62* | (2010.01) |
| *H01L 33/06* | (2010.01) |

(52) U.S. Cl.
CPC ...... *H01L 21/6835* (2013.01); *H01L 21/6715* (2013.01); *H01L 21/67138* (2013.01); *H01L 25/0753* (2013.01); *H01L 33/06* (2013.01); *H01L 33/24* (2013.01); *H01L 33/405* (2013.01); *H01L 33/44* (2013.01); *H01L 33/62* (2013.01); *H01L 2221/68363* (2013.01); *H01L 2221/68372* (2013.01)

(58) Field of Classification Search
CPC ........... H01L 21/6835; H01L 21/67138; H01L 21/6715; H01L 25/0753; H01L 33/06; H01L 33/24; H01L 33/405; H01L 33/44; H01L 33/62; H01L 2221/68363; H01L 2221/68372
See application file for complete search history.

(56) References Cited

U.S. PATENT DOCUMENTS

| | | | |
|---|---|---|---|
| 2017/0278733 A1* | 9/2017 | Chang | H01L 33/36 |
| 2018/0204973 A1* | 7/2018 | Jeung | H01L 33/32 |
| 2020/0020825 A1* | 1/2020 | Yang | H01L 33/0093 |
| 2021/0043797 A1* | 2/2021 | Ahn | H01L 33/48 |

* cited by examiner

*Primary Examiner* — Seahvosh Nikmanesh
(74) *Attorney, Agent, or Firm* — Fenwick & West LLP (57) ABSTRACT

Embodiments relate to using photocurable polymers to place light emitting diodes (LEDs) onto an electronic display substrate after fabrication of the LEDs. A LED assembly system places LEDs on a temporary substrate after fabrication and applies a a photocurable polymer onto the top surfaces of the LEDs. A transparent pickup head aligns with a subset of the LEDs. The pickup head is positioned on the top surfaces of the subset of LEDs such that the layer of the photocurable polymer is in between the pickup head and the top surface of the subset of the LEDs. Light is directed through the pickup head to cure the photocurable polymer, adhering the subset of LEDs to the pickup head. The subset of LEDs is removed away from the temporary substrate, due to relative movement between the temporary substrate and the pickup head.

10 Claims, 12 Drawing Sheets

PICKUP HEAD WITH PHOTOCURABLE POLYMERS FOR ASSEMBLING LIGHT EMITTING DIODES

CROSS-REFERENCE TO RELATED APPLICATION

This application claims priority under 35 U.S.C. § 119(e) to U.S. Provisional Patent Application No. 62/892,418 filed on Aug. 27, 2019, which is incorporated by reference herein in its entirety.

BACKGROUND

The present disclosure relates to semiconductor device fabrication, specifically to using photocurable polymers to place light emitting diodes (LEDs) on target substrates after fabrication.

In LED display fabrication, LEDs may be moved from one substrate to another. For example, micro-LEDs of different colors may be transferred from carrier substrates to a display substrate including control circuits for the micro-LEDs to manufacture an electronic display. As the form factor of LED's decreases, the picking and placing of LEDs into desired arrangements and without damaging the LEDs becomes increasingly difficult.

SUMMARY

Embodiments relate to using photocurable polymers to move semiconductor devices from one substrate to another substrate. Using photocurable polymers may facilitate and increase adhesion with a pickup head for pick and place operations during the manufacturing of an electronic display.

In some embodiments, a photocurable polymer is deposited across top surfaces of a set of light emitting diodes (LEDs) mounted on a temporary substrate. A pickup head is placed on the top surface of the subset of the LEDs, with the photocurable polymer between the pickup head and the top surface of the subset of the LEDs. A portion of the photocurable polymer that is between the pickup head and the subset of the LEDs is cured by directing light through the pickup head. The subset of the LEDs is removed away from the temporary substrate by causing relative movement between the temporary substrate and the pickup head attached with the subset of LEDs.

In some embodiments, an LED assembly system comprises a polymer application tool that deposit the photocurable polymer across top surfaces of the set of LEDs. The LEDs are mounted on a temporary substrate. The LED assembly system comprises a light source configured to cure one or more portions of the photocurable polymer between a subset of one or more pickup heads and corresponding LEDs. The LED assembly system comprises one or more pickup heads configured to attach to one or more LEDs via the one or more cured portions of the photocurable layer and remove the one or more LEDs attached to the one or more pickup heads away from the temporary substrate. The LED assembly system removes the one or more LEDs attached to the one or more pickup heads away from the temporary substrate by relative movement between the temporary substrate and the one or more pickup heads.

BRIEF DESCRIPTION OF DRAWINGS

Figure (FIG. 1 illustrates a cross-sectional view of a LED, in accordance with an embodiment.

The figures depict various embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments relate to placing light emitting diodes (LEDs) from a substrate onto a target substrate after the LEDs are fabricated using a photosensitive polymer that are cured between a pickup head and the LEDs. One or more of the LEDs placed onto a temporary substrate are picked up and from the temporary substrate. To facilitate the pickup head's adhesion to the LED, a photosensitive polymer is applied to the LEDs while they are on the temporary substrate. The pickup head is made of material that allows light to pass through (e.g., the material is translucent or transparent). After the pick-up head is placed on the photosensitive polymer, the photocurable polymer below the pick-up head is cured by directing light through the pick-up head, causing adhesion between the one or more LEDs and the pickup head. The pickup head moves the one or more LEDs away from the temporary substrate and places them on a target substrate of an electronic display.

Embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Example LED Structure

Figure 1:
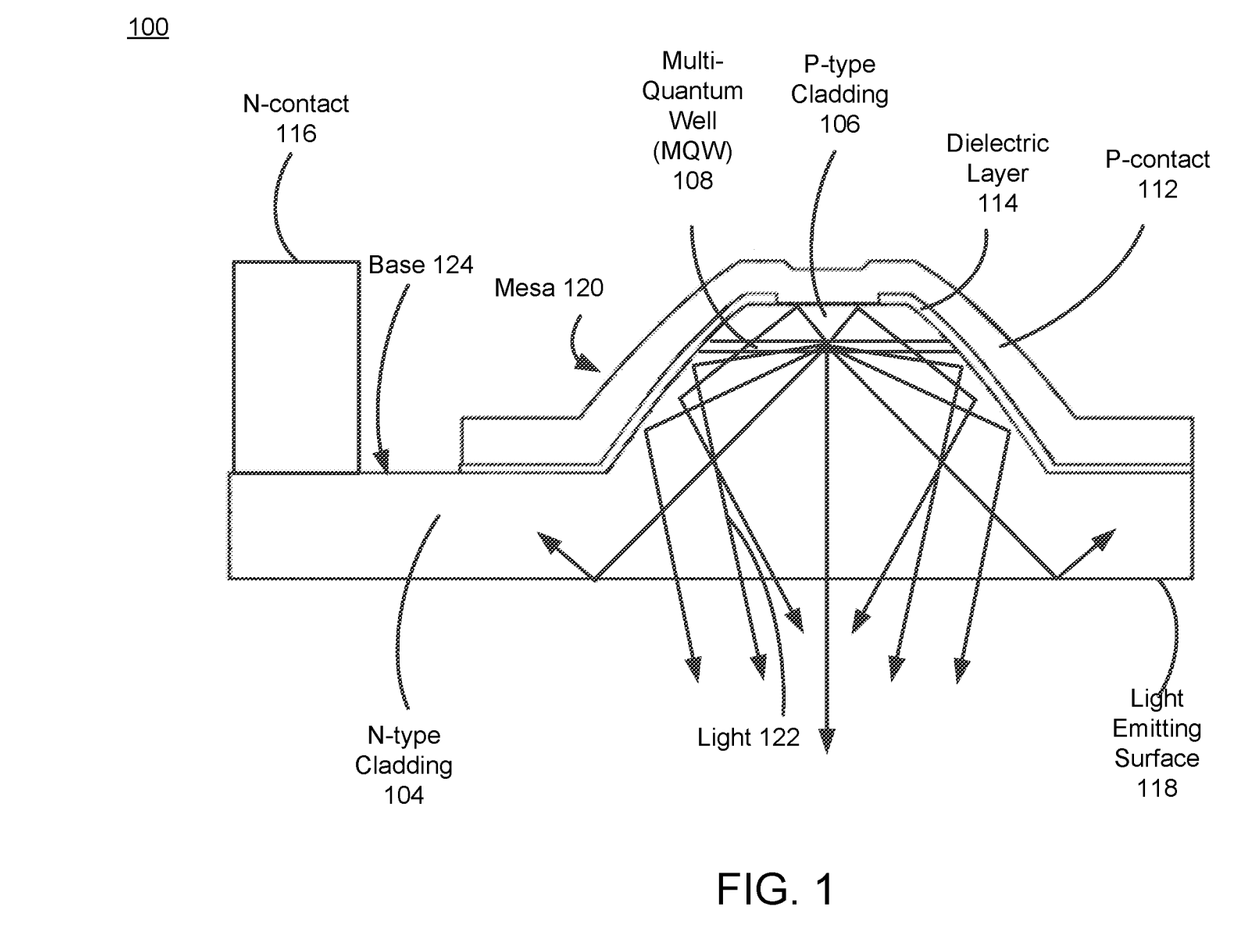

FIG. 1 illustrates a cross-sectional view of a LED 100, in accordance with an embodiment. The LED 100 is an example of a semiconductor device on which a photocurable polymer is deposited to facilitate pick and place of the semiconductor device from a temporary substrate to a target substrate. In some embodiments, the LED 100 may be a micro LED. In some embodiments, the feature size of the micro LED (e.g., the diameter) may range from sub-micrometers to tens of micrometers (e.g., from 0.1 μm to 10 μm) and have a small active light emitting area (e.g., less than 2,000 μm$^2$). The collimated light output increases the brightness level of light emitted from the small active light emitting area. The micro LED may be one of many micro LEDs of an array on a target substrate, with the pitch (e.g., spacing between micro LEDs) ranging from sub-micrometers to tens of micrometers.

The LED 100 may include, among other components, a semiconductor structure including an n-type cladding 104, a p-type cladding 106, and a multi-quantum well ("MQW") 108 between the n-type cladding 104 and the p-type cladding 106. The LED 100 further includes a dielectric layer 114 on the semiconductor structure, a p-contact 112 on the dielectric layer 114, and an n-contact 116 on the n-type cladding 104. The semiconductor structure is shaped, such as via an etch process, into a mesa 120 and a base 124 of the mesa 120. The p-type cladding 106 defines the top of the mesa 120, and the n-type cladding 104 defines a portion of the mesa 120 and the base 124. In some embodiments, an n-type cladding defines the top portion of the mesa 120 and a p-type cladding defines the bottom portion of the mesa 120 and the base 124. Here, the p-contact 112 is an n-contact and the n-contact 116 is a p-contact.

The multi-quantum well 108 defines an active light emitting area that is included in the structure of the mesa 120. The LED 100 may include one or more quantum wells. The mesa 120 may include a truncated top defined on a side opposed to a light emitting surface 118 of the LED 100. In some embodiments, the semiconductor structure including the n-type cladding 104, MQW 108, and p-type cladding 106 is an epitaxial structure grown on a growth substrate. A photosensitive polymer may be formed on the light emitting surface 118 using a polymer application tool, discussed in detail with respect to FIG. 7.

The mesa 120 may include various shapes, such as a parabolic shape with a truncated top, to form a reflective enclosure for light 122 generated within the LED 100. In other embodiments, the mesa 120 may include a cylindrical shape with a truncated top, or a conic shape with a truncated top, or some other light-collimating shape. The arrows show how the light 122 emitted from the MQW 108 is reflected off the p-contact 112 and internal walls of the mesa 120 toward the light emitting surface 118 at an angle sufficient for the light to escape the LED 100 (i.e., within a critical angle of total internal reflection). The p-contact 112 and the n-contact 116 are examples of contacts of the semiconductor device 100, and electrically connect the LED 100, such as to a display substrate including a control circuit for the LED 100. The n-contact 116 is formed at the base 124, which is defined by a surface of the n-type cladding 106 opposite the light emitting surface 118. The n-contact 116 may include a conductive material that extends to the top of the mesa 120 to support the placement of the LED 100 on the display substrate with the p-contact 112 and the n-contact 116 bonded to the display substrate.

The LED 100 may include an active light emitting area defined by the MQW 108. The LED 100 directionalizes the light output from the MQW 108 and increases the brightness level of the light output. In particular, the p-contact 112 may be reflective for the light 122 emitted from the MQW 108. The mesa 120 and p-contact 112 cause reflection of the light 122 from the MQW 108 to form a collimated or quasi-collimated light beam emerging from the light emitting surface 118.

The mesa 120 may be formed by etching into the semiconductor structure including the n-type cladding 104, the MQW 108, and the p-type cladding 106, during wafer processing steps. The etching results in the MQW 108 being in the structure of the mesa 120, and at a particular distance to the p-contact 112 to facilitate the collimation of the light 122. In some embodiments, the MQW 108 is at a parabola focal point defined by the parabolic shape of the mesa 120. A portion of the generated light 122 is reflected at the mesa 120 to form the quasi-collimated light beam emitted from the light emitting surface 118.

While this application discusses primarily micro LEDs, in other embodiments the LEDs 100 may comprise any semiconductor device having a gallium semiconductor layer, including semiconductor devices including gallium-based epitaxial layers grown on substrates. In some embodiments, the semiconductor layer may be composed of at least one of indium gallium nitride (InGaN), gallium phosphide (GaP), gallium arsenide phosphide (GaAsP), aluminum indium gallium phosphate (AlInGaP), and gallium arsenide (GaAs).

Example Process of LED Display Pickup and Placement

Figure 2:
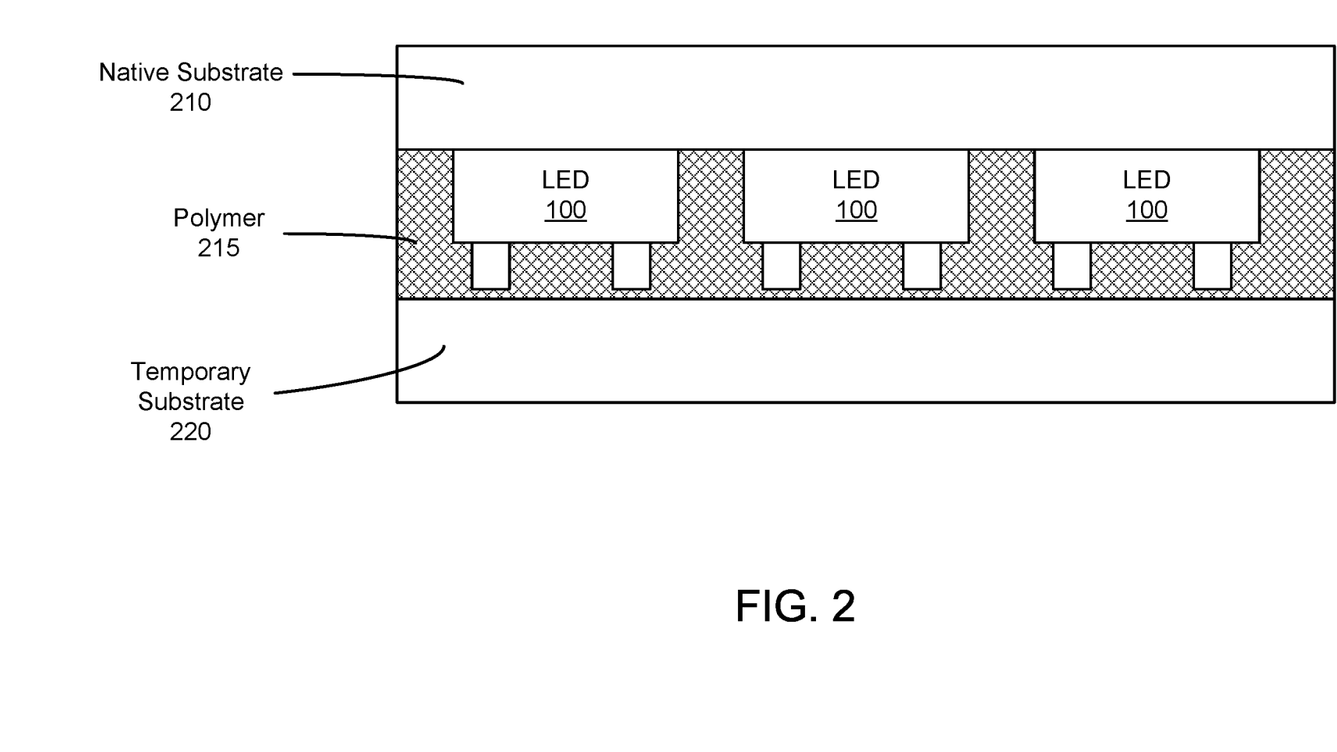
FIG. 2 illustrates a cross-sectional view of LEDs on a temporary substrate, in accordance with an embodiment.

FIG. 2 illustrates a cross-sectional view of LEDs 100 on a temporary substrate 220, in accordance with an embodiment. Post fabrication, the LED assembly system includes the LEDs 100, a native substrate 210, a polymer 215, and a temporary substrate 220. The LEDs 100 are formed on the native substrate 210. The native substrate 210 may be a sapphire (single-crystal) or Gallium Arsenide (GaAs), for example. The LED assembly system places the LEDs 100 onto the temporary substrate 220, coupling the LEDs to the temporary substrate 220 via the polymer 215 (e.g., a resin). The temporary substrate 220 may be made of a material (e.g., glass) with sufficient strength to provide support for the LEDs 100 during transport or other processes before moving the LEDs 100 onto a target substrate.

Figure 3:
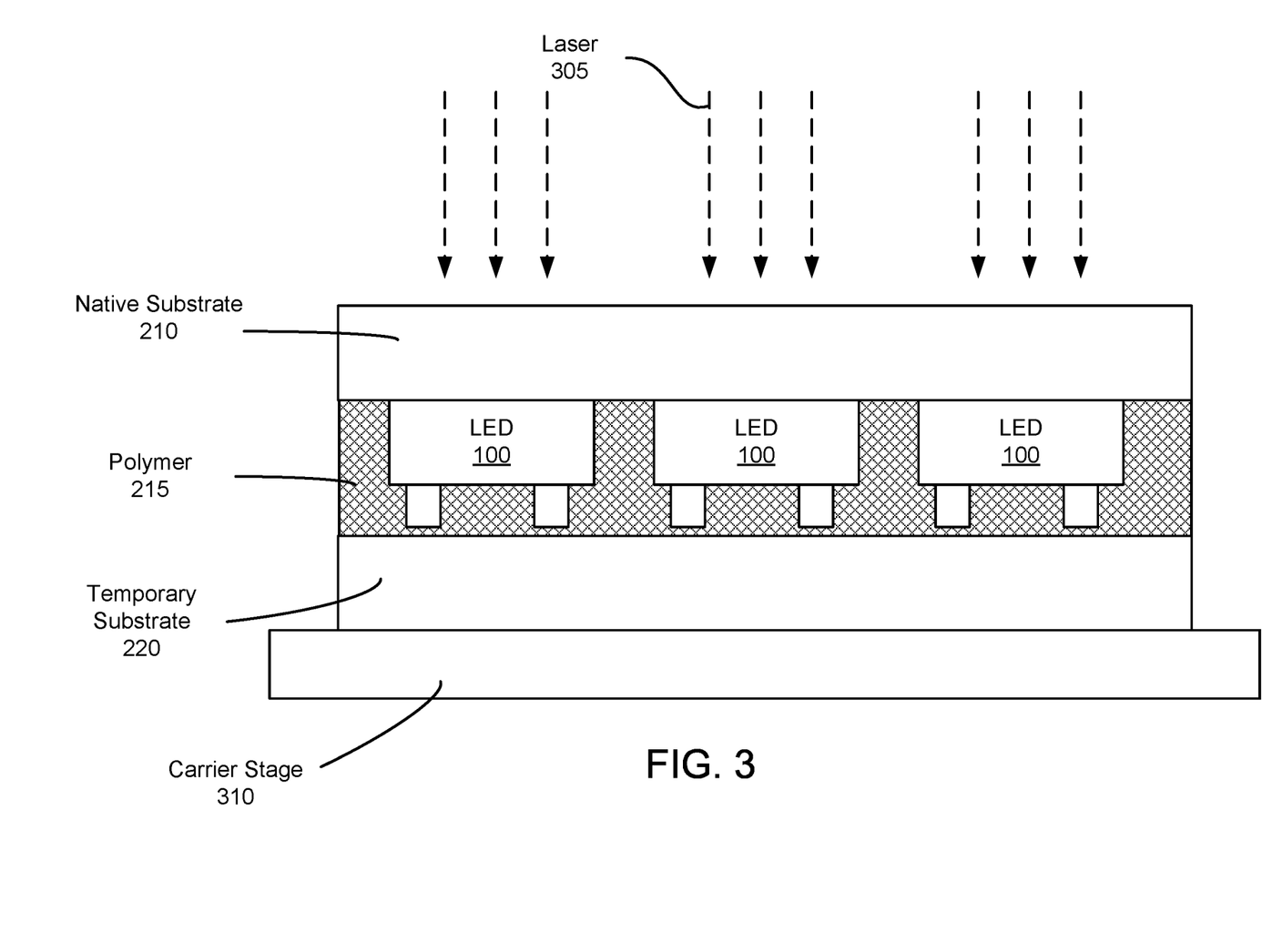
FIG. 3 illustrates a cross-sectional view of LEDs being exposed to a laser through a native substrate, in accordance with an embodiment.
Figure 4:
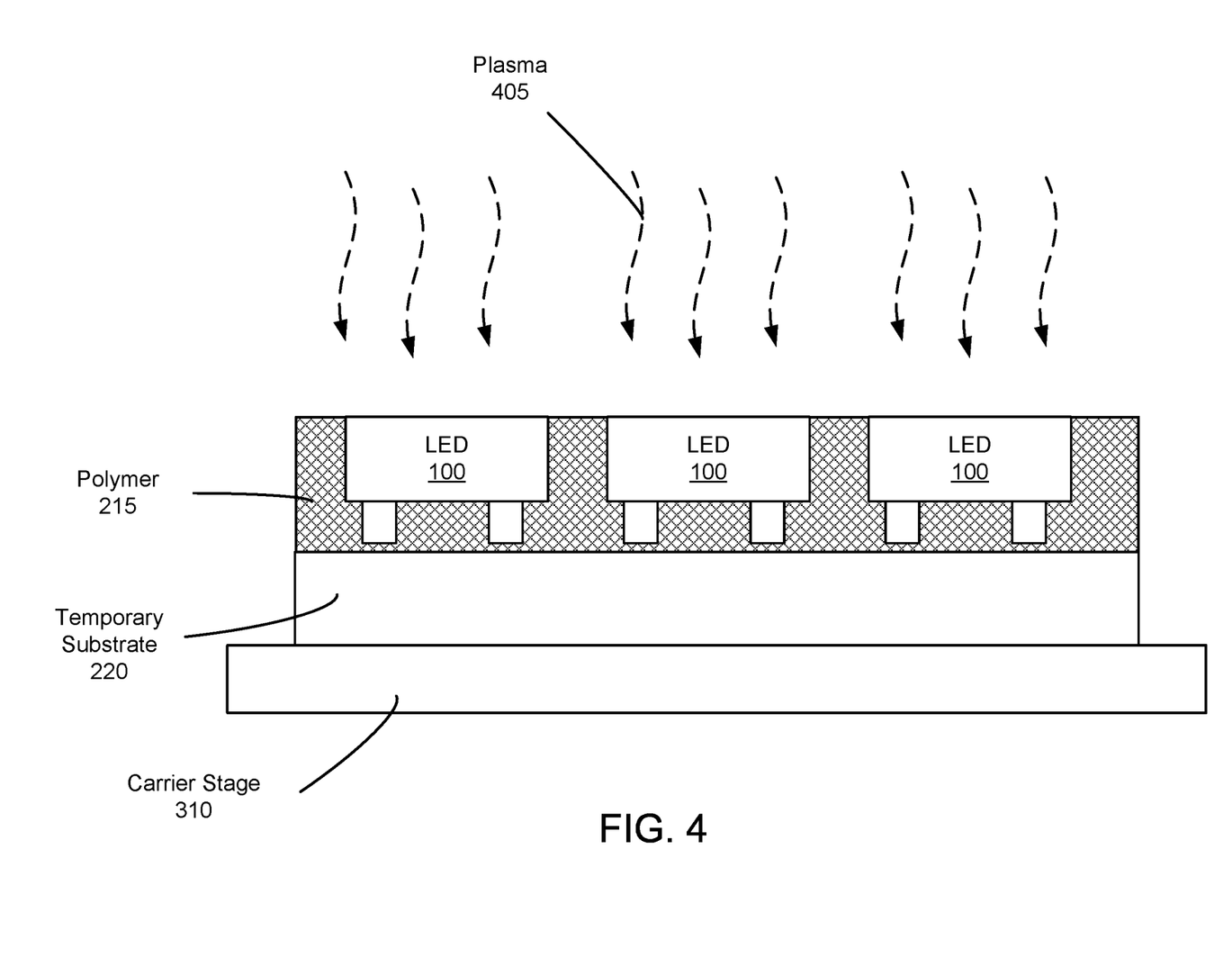
FIG. 4 illustrates a cross-sectional view of LEDs on the temporary substrate with plasma directed to a polymer coupled to the LEDs, in accordance with an embodiment.

FIG. 3 illustrates a cross-sectional view of LEDs 100 being exposed to a laser through the native substrate 210, in accordance with an embodiment. A LED assembly system may include a laser source that produces a laser 305 and a carrier stage 310, on which the LEDs 100 coupled to the temporary substrate 220 may be placed, discussed in further detail with respect to FIG. 7. The laser 305 passes through the native substrate and causes reaction at the interface of the LEDs 100 and the native substrate 210 that weakens the bonding between the LEDs and the native substrate 210. The weakening of the bonding enables the native substrate 210 to be removed away from the LEDs 100 while retaining the LEDs 100 attached to the temporary substrate 220 via the polymer 215. Such a process is referred to as a laser lift-off process. The carrier stage 310 secures the temporary substrate 220 for further operations, and may include a heat source that heats the carrier stage 310 to a temperature for subsequent operations. The removal of the native substrate 210 results in the structure as illustrated in FIG. 4. In some embodiments, the native substrate 210 may be removed by wet etching. For example, if the native substrate 210 is made of GaAs, the native substrate 210 be removed by exposure to citric acid and/or phosphoric acid mixed with hydrogen peroxide.

FIG. 4 illustrates a cross-sectional view of LEDs 100 on the temporary substrate 220 being exposed with plasma 405, in accordance with an embodiment. The plasma 405 removes at least a portion of the polymer 215 that couples the LEDs 100 to the temporary substrate 220. By exposing the polymer 215 to the plasma 405 (e.g., radio frequency plasma), the polymer is at least partially removed to facilitate the subsequent step of removing the LEDs 100 from the temporary substrate 220.

Figure 5A:
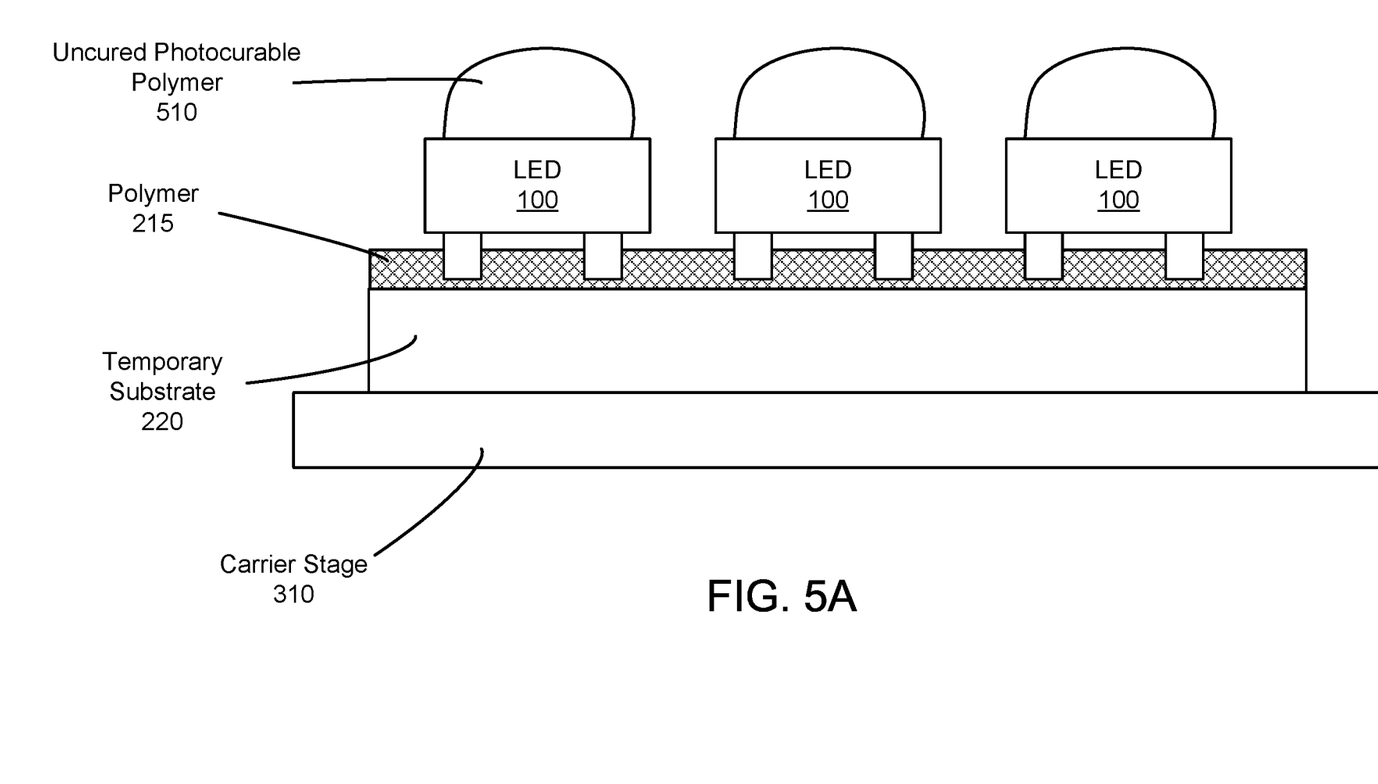
FIG. 5A illustrates a cross-sectional view of LEDs on the temporary substrate with an uncured photosensitive polymer, in accordance with an embodiment.

FIG. 5A illustrates a cross-sectional view of LEDs 100 on the temporary substrate 220 with an uncured photocurable polymer 510, in accordance with an embodiment. The photocurable polymer 510 may be used to adhere to a pickup head. A singulated droplet of the uncured photocurable polymer 510 is deposited over a top surface of each LED 100. In some embodiments, the uncured photocurable polymer 510 is deposited by jetting and/or spin coating. The photocurable polymer 510 may be a resin that cures when exposed to light by cross-linking of the polymer chains of the photocurable polymer 510.

Figure 5B:
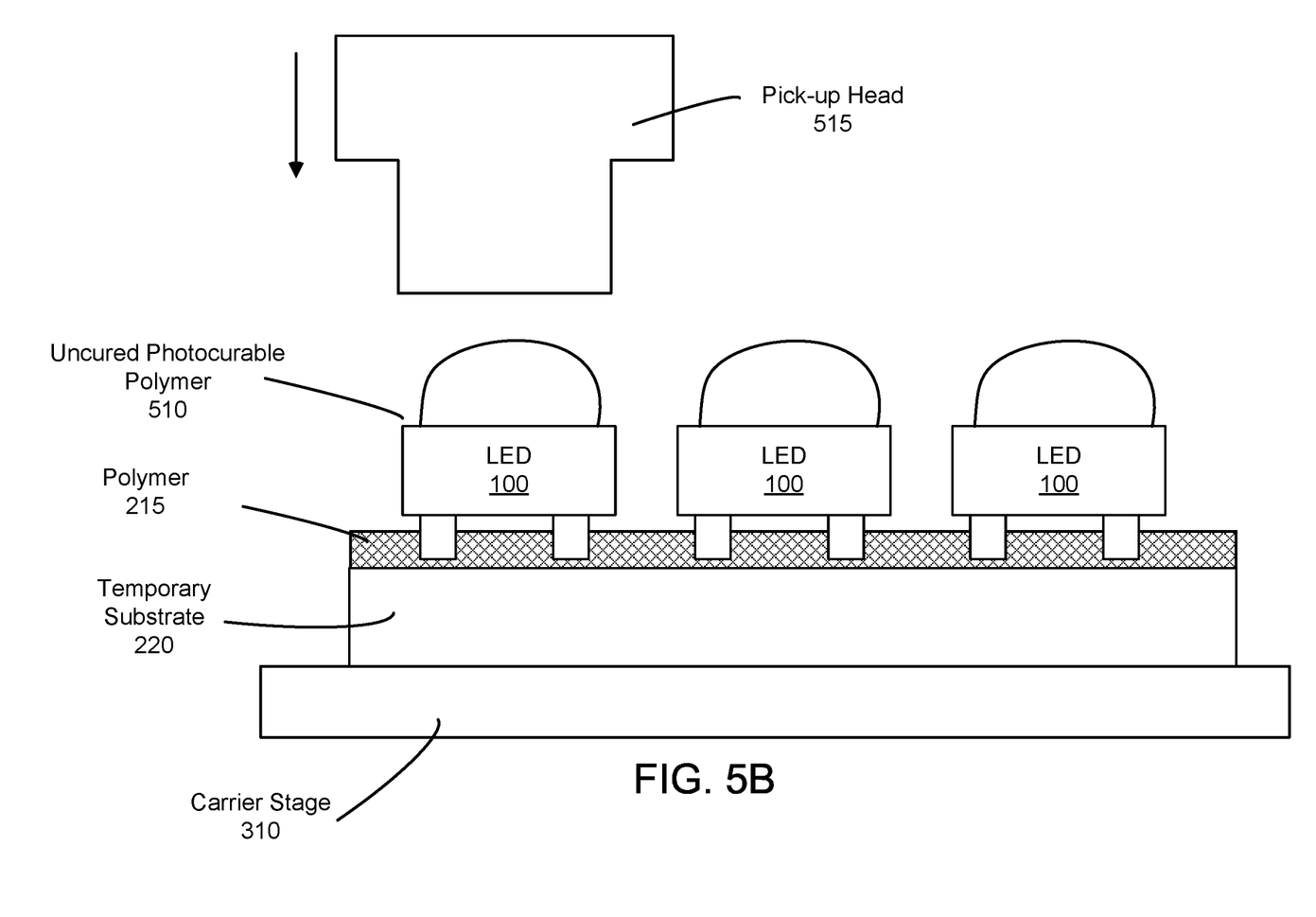
FIG. 5B illustrates a cross-sectional view of LEDs on the temporary substrate and a pickup head, in accordance with an embodiment.

FIG. 5B illustrates a cross-sectional view of LEDs 100 on the temporary substrate 220 and a pickup head 515, in accordance with an embodiment. The pickup head 515 is used to remove a subset of LEDs away from the temporary substrate 220 and placing the pickup array onto the target substrate 560. The pickup head 515 has a flat surface at one end that can be placed against at least a portion of a top surface of an LED 100. The pickup head 515 may have a body made of a material that allows light to pass through and has a coefficient of thermal expansion (CTE) close to a CTE of an LED 100. The CTE of the body of the pickup head 515 has a CTE that is sufficiently close to the CTE of the LED 100 such that the thermal stress due to CTE difference between the pickup head 515 and the LED 100 does not deform or crack the LED during temperature fluctuations in the LED assembly process. A sufficiently close match between the CTEs of the body of the pickup head 515 and the LED 100 also helps maintain lateral alignment between the LED 100 and the target substrate 560 during bonding. The pickup head may be made of fused silica. The LED assembly system may include a pickup head array that includes a plurality of pickup heads similar to the pickup head 515.

Figure 5C:
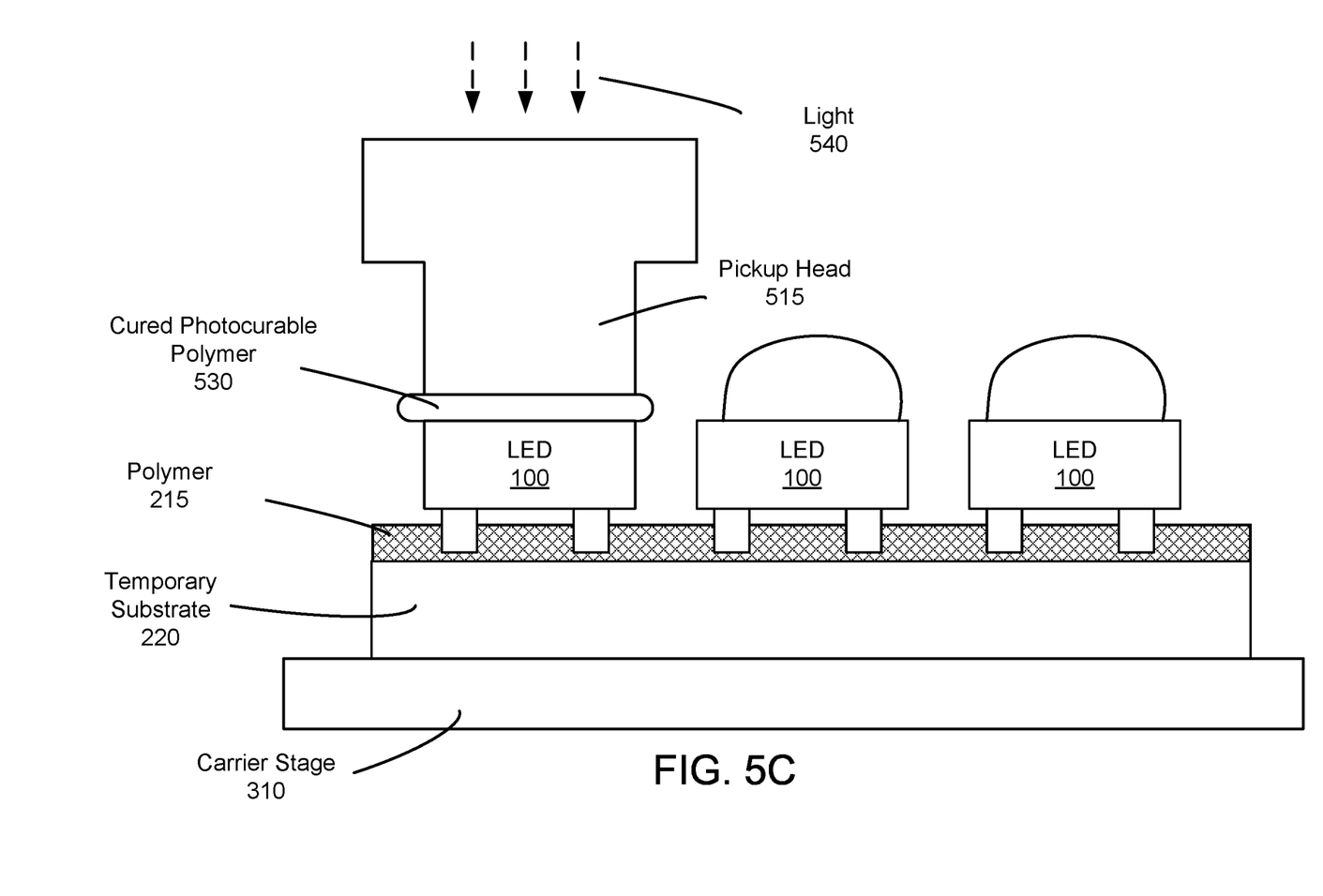
FIG. 5C illustrates a cross-sectional view of LEDs on the temporary substrate with the pickup head aligned with an LED, in accordance with an embodiment.

FIG. 5C illustrates a cross-sectional view of LEDs 100 on a temporary substrate 220 with a pickup head 515 aligned with a LED 100, in accordance with an embodiment. The LED assembly system may align the pickup head 515 with the LED 100 via an imaging device. The imaging device may facilitate the alignment of the pickup head 515 and the LED 100 by capturing an image of the LED 100 through the transparent body of the pickup head 515. The LED assembly system may include a light source that produces light 540. The light 540 is directed through the pickup head 515, resulting in the cured photocurable polymer 530. The light 540 may be visible light and/or ultraviolet light. The cured photocurable polymer 530 is located between the pickup head 515 and the LED 100, adhering to both. Accordingly, the cured photocurable polymer 530 couples the pickup head 515 to the LED 100. In some embodiments, the photocurable polymer level on a subset of the LEDs 100 may be cured selectively. For example, a pickup head array, including the pickup head 515, may align with two of the LEDs 100 shown in FIG. 5C, rather than all the LEDs 100. The light 540 may be directed only to selected LEDs, such that only those selected adhere to the pickup head array. Selective curing and picking of LEDs is useful when a subset of the LEDs 100 is defective or unwanted, for example.

Figure 5D:
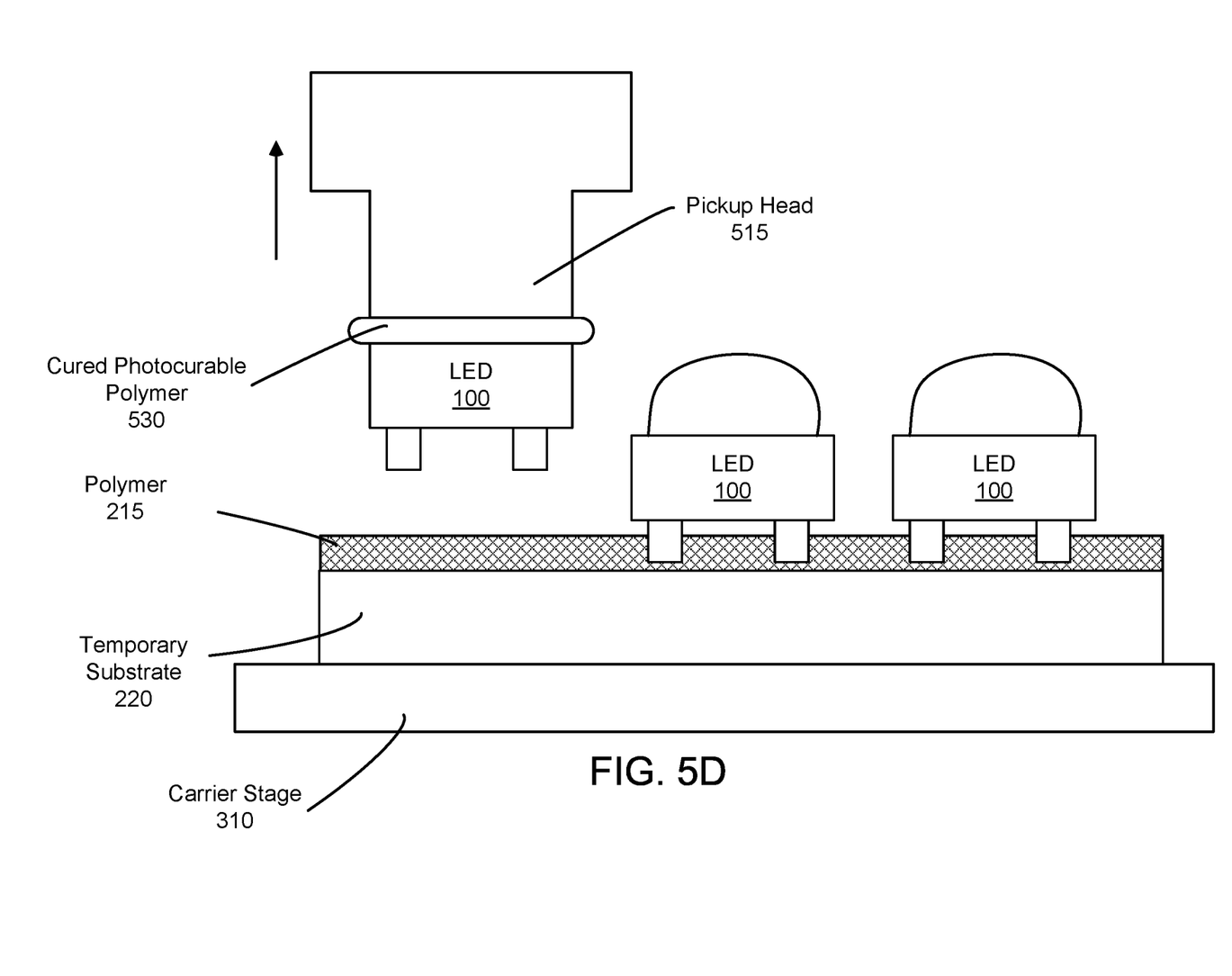
FIG. 5D illustrates a cross-sectional view of the LED removed away from the temporary substrate by the pickup head, in accordance with an embodiment.

FIG. 5D illustrates a cross-sectional view of an LED 100 removed away from the temporary substrate 220 by the pickup head 515, in accordance with an embodiment. The cured photocurable polymer 530 enables the pickup head 515 to adhere to the LED 100. The pickup head 515 picks up the LED 100, removing the LED 100 away from the temporary substrate 220. In some embodiments, the temporary substrate 220 may be pulled away from the LED 100, while the LED 100 is kept in place by the pickup head 515.

Figure 5E:
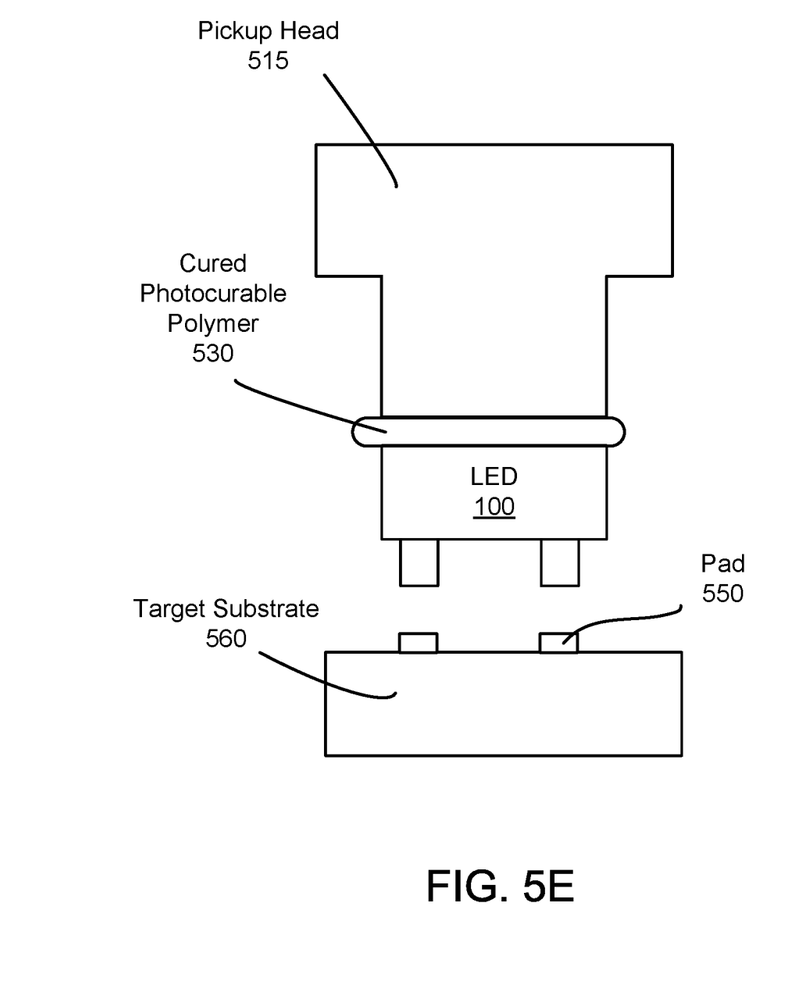
FIGS. 5E and 5F illustrate cross-sectional views of the LED being placed on a target substrate by the pickup head, in accordance with an embodiment.
Figure 5F:
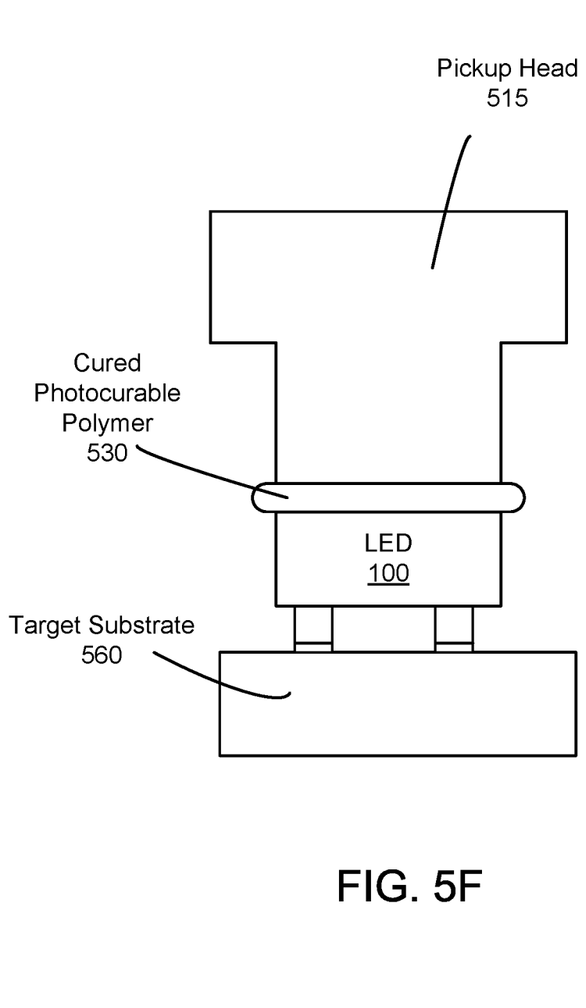

FIGS. 5E and 5F illustrate cross-sectional views of the LED 100 being placed on the target substrate 560 by the pickup head 515, in accordance with an embodiment. Once the pickup head 515 attaches to the LED 100 and enables relative movement between the LED 100 and the temporary substrate, the pickup head 515 may place the LED 100 on the target substrate 560. The target substrate 560 may include a pixel control circuit of an electronic display and at least one electrical contact pad 550 for powering the LED 100. The target substrate 560 may be positioned on a target stage (not pictured in FIGS. 5E-F). Each electrical contact pads 550 aligns with an electrode of the LED 100, such that the LED 100 mounts to the target substrate 560. The electrical contact pads 550 may couple to the LED 100 via thermal compression. The target stage may include a heater that increases the temperature of an electrode of the LED 100 and a corresponding electrical contact pad 550. The pickup head 515 may apply pressure when placing the LED 100 onto the target substrate 560, thus compressing the electrical contact pad 550 and the LED 100. In some embodiments, once the LED 100 and the corresponding electrical contact pad 550 are aligned on the target substrate 560, a laser (e.g., the laser 305) may be directed through the pickup head 515 to bond the LED 100 and the electrical contact pad 550 via laser bonding. Note that the pickup head 515 may be optically transparent and/or translucent to allow the laser beam through. In other embodiments, the LED-electrical contact pad bonding may occur via wire bonding, surface activated bonding, or some combination thereof.

Figure 5G:
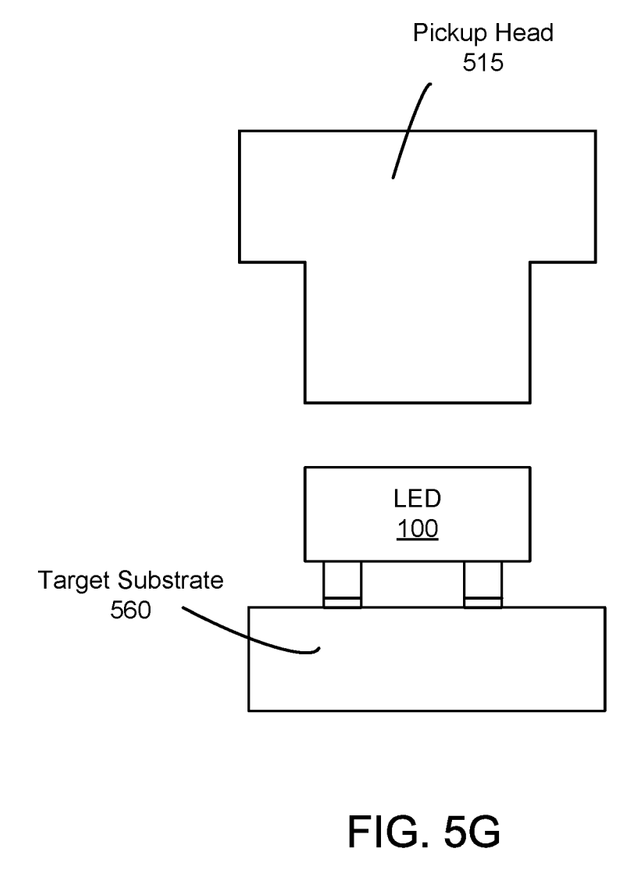
FIG. 5G illustrates a cross-sectional view of the LED being released onto a target substrate by a pickup head, in accordance with an embodiment.

FIG. 5G illustrates a cross-sectional view of the LED 100 being released onto the target substrate 560 by the pickup head 515, in accordance with an embodiment. After or during bonding of the LED 100 to the target substrate 560, the cured photocurable polymer 530 may be decomposed. For example, the cured photocurable polymer 530 may be decomposed by thermal decomposition during the thermal compressive bonding and/or performing wet etching on the photocurable polymer 530. In some embodiments, the pickup head 515 may include a heat source to apply heat to the cured photocurable polymer layer 530. In other embodiments, heat induced by directing a laser (e.g., the laser 305) through the pickup head 515 and/or plasma etching facilitate the removal of the cured photocurable polymer layer 530. In other embodiments, components of the LED assembly system other than the pickup head 515 may facilitate the decomposition of the cured photocurable polymer 530. After the cured photocurable polymer 530 is decomposed, the pickup head 515 may release the LED 100 onto the target substrate 560. In some embodiments, the pickup head 515 places the LED 100 onto the target substrate 560 and subsequently, the LED 100 bonds to the target substrate 560. The bonding strength between the LED 100 and the target substrate 560 may be sufficient to release the LED 100 from the pickup head 515.

In some embodiments, the pickup head 515 may be reused after one pick and place operation by removing the cured photocurable polymer and cleaning the pickup head 515.

Figure 6:
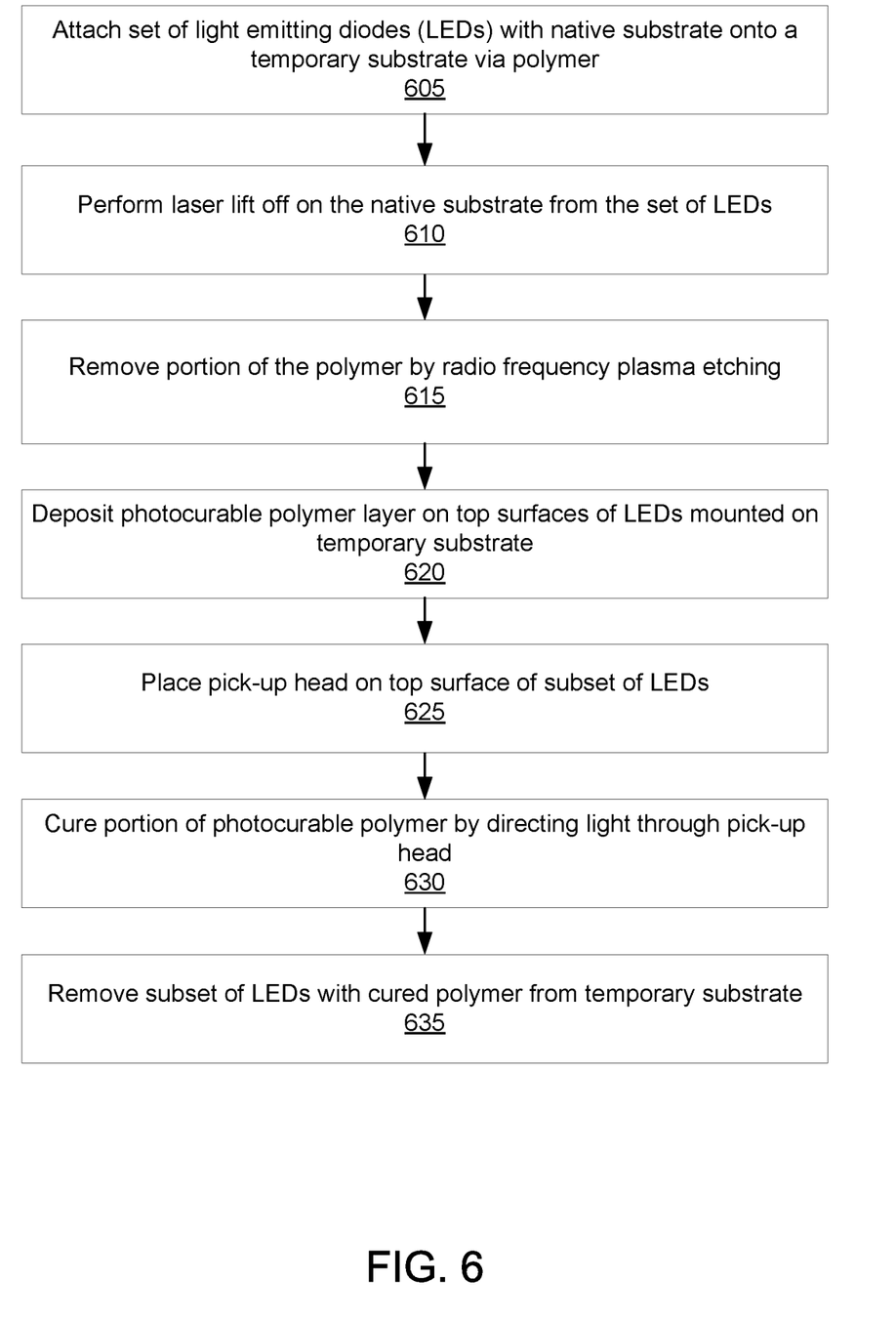
FIG. 6 is a flowchart illustrating a process for removing LEDs from a temporary substrate using a photocurable polymer, in accordance with an embodiment.

FIG. 6 is a flowchart illustrating a process for removing LEDs from a temporary substrate using a photocurable polymer, in accordance with an embodiment. An LED assembly system attaches 605 a set of LEDs (e.g., the set of LEDs 100) coupled to a native substrate (e.g., the native substrate 210) onto a temporary substrate (e.g., the temporary substrate 220), via a polymer (e.g., the polymer 215). The LED assembly system performs 610 laser lift-off of the native substrate from the set of LEDs.

The LED assembly system removes 615 a portion of the polymer by radio frequency plasma etching. The LED assembly system deposits 620 a photocurable polymer (e.g., the uncured photocurable polymer 510) on the top surfaces of the set of LEDs.

The LED assembly system cures 630 a portion of the photocurable polymer (e.g., the cured photocurable polymer 530) by directing light through a pickup head (e.g., the pickup head 515).

The LED assembly system removes 635 a subset of the LEDs, via the cured photocurable polymer, away from the temporary substrate.

The processes illustrated in FIG. 6 may be performed in a different order or the processes may be omitted. For example, performing 610 of laser lift-off may be performed in parallel with the removing 615 of the portion of the polymer via dry etching.

Figure 7:
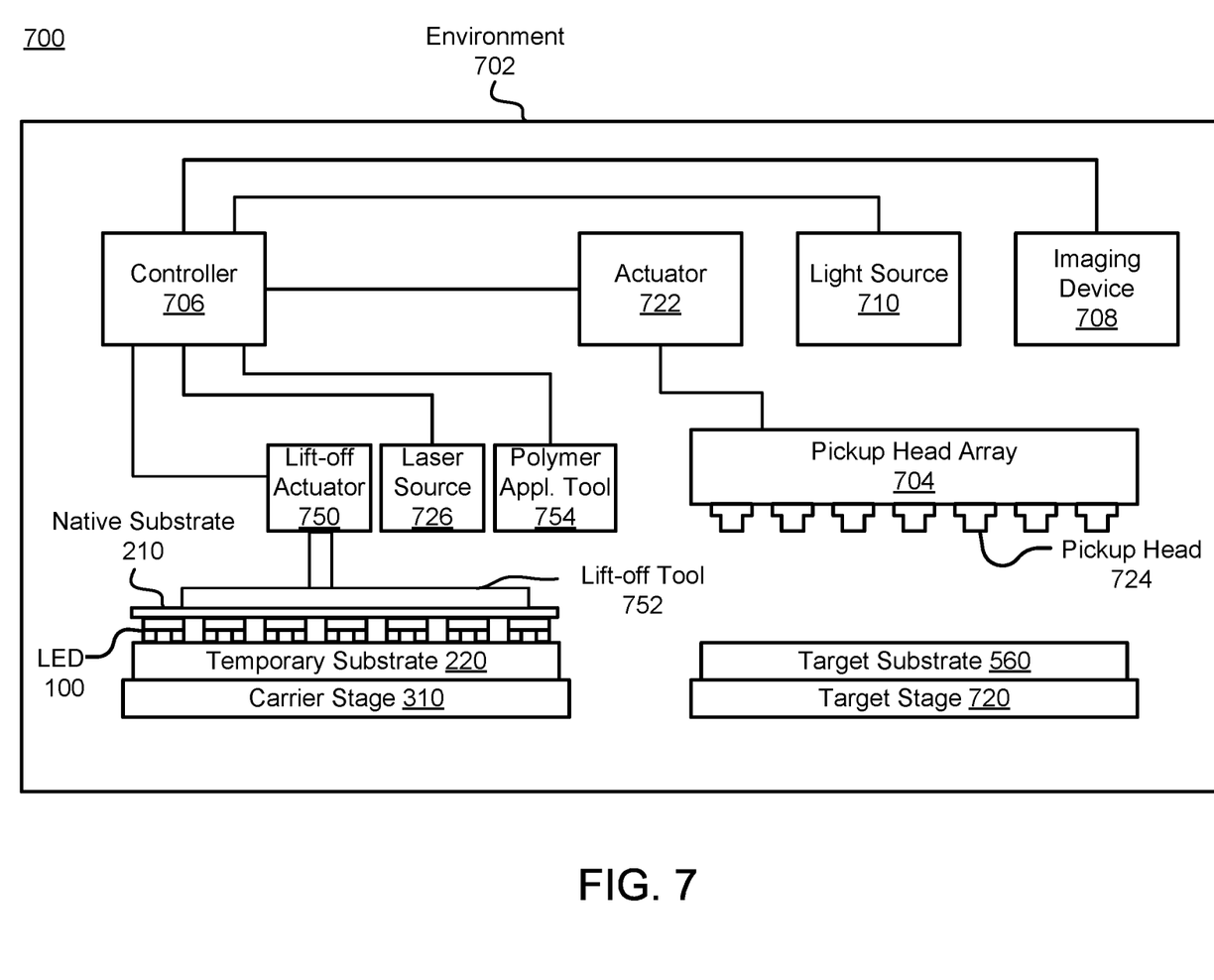
FIG. 7 is a system diagram of a display assembly system, in accordance with an embodiment.

FIG. 7 is a system diagram of an LED assembly system 700, in accordance with an embodiment. The system 700 fabricates a display device by assembling a plurality of LEDs 100 onto the target substrate 560. In some embodiments, the LEDs 100 are different color light emitting diode (LED) dies. The temporary substrate 220 may be a carrier that holds the LEDs 100 for pick up by the pickup head array 704.

The target substrate 560 may be a display substrate, or may be an intermediate carrier substrate that facilitates bonding with a display substrate. The system 700 places LEDs 100 at pixel locations of the display substrate, and then bonds the LEDs 100 to the display substrate. In some embodiments, the LEDs 100 are micro LEDs having a reduced divergence of light output and small light emitting area is comparison to conventional LEDs.

The system 700 includes an environment 702 for picking and placing the LEDs 100. The system 700 further includes a pickup head array 704, an imaging device 708, an actuator 722, the carrier stage 310, a target stage 720, a laser source 726, a lift-off actuator 750, a lift-off tool 752, and a polymer application tool 754, located within the environment 702. In some embodiments, the environment 702 is an interior environment of a SEM chamber and the imaging device 708 is a scanning electron microscope (SEM).

The carrier stage 310 holds the temporary substrate 220, which holds the LEDs 100. The target stage 720 holds the target substrate 560 to receive some or all of the LEDs 100 from the temporary substrate 220. A controller 706 is coupled to the imaging device 708 and the pickup head array 704 (e.g., via the actuator 722) and controls the operations of the imaging device 708 and pickup head array 704. For example, the controller 706 causes the pickup head array 704 to pick up one or more LEDs 100 located on the temporary substrate 220, and place the one or more LEDs 100 on the target substrate 560.

The pickup head array 704 includes a plurality of pickup heads 724 (e.g., the pickup head 515). Each pickup head 724 can pick up the LEDs 100, from the temporary substrate 220, and place the LEDs 100 on the target substrate 560. After picking up an LED 100, the pickup head 724 is aligned with a location on the target substrate 560. The pickup head 724 is then separated from the LED 100 after placing the LED 100 at the location on the target substrate 560.

The actuator 722 is an electro-mechanical component that controls the movement of the pickup head array 704 based on instructions from the controller 706. For example, the actuator 722 may move the pickup head array 704, or individual pickup heads 724, with three degrees of freedom including up and down, left and right, and forward and back. In various embodiments, the actuator 722 may be, for example, a rotating motor, a linear motor, or a hydraulic cylinder.

The imaging device 708 facilitates a visual alignment for LED pickup from the temporary substrate 220, and alignment for placement of LEDs on the target substrate 560. For example, the imaging device 708 generates images of the pickup head array 704 and the temporary substrate 220, and provides the images to the controller 706. The controller 706 aligns the one or more pickup heads 724 of the pickup head array 704 with the temporary substrate 220 based on the images, and picks up one or more LEDs 100 mounted on the temporary substrate 220. As another example, the imaging device 708 generates images of the one or more pickup heads 724 of the pickup head array 704 and the target substrate 560, and provides the images to the controller 706. The controller 706 aligns the one or more pickup heads 724 with the target substrate 560 based on the images, and places the LEDs 100 attached to the one or more pickup heads 724 on the target substrate 560. Each pickup head 724 may be optically translucent, transparent, or some combination thereof, allowing the imaging device to capture the alignment of the pickup head 724 through the pickup head 724 itself.

In some embodiments, the imaging device 708 is an environmental scanning electron microscope (ESEM) to provide images without specimen coating. In these embodiments, the environment 702 is an ESEM chamber including a high pressure atmosphere of water vapor. The use of an SEM is advantageous for picking and place small semiconductor device, such as micro-LED dies. In various embodiments, other types of imaging devices may be used to facilitate the alignments.

The light source 710 provides light to direct through the pickup heads 724 of the pickup head array 704. After aligning a pickup head 724 with a LED 100, the LED assembly system 700 projects light to cure a photosensitive polymer applied onto a top surface of the LED 100. The cured photosensitive polymer attaches the pickup head 724 to the LED 100. The light source 710 produces ultraviolet light and/or visible light.

In some embodiments, the carrier stage 310 and/or target stage 720 can be adjusted to facilitate precision alignment with the pickup head array 704. For example, the carrier stage 310 and/or target stage 720 may include three degrees of freedom. The degrees of freedom may include left and right, backward and forward, and a yaw rotational degree of freedom. The temporary substrate 220 is moved with the carrier stage 310, and the target substrate 560 is moved with the target stage 720.

The system 700 may include one or more temporary substrates 220. For example, different temporary substrates 210 may carry different color LED dies. A temporary substrate 220 may be carrier film that holds singulated LEDs for transfer to the target substrate 560. The system may include one or more target substrates 560. In some embodiments, such as when the target substrate 560 is the target substrate for receiving the LEDs 100, the target stage 720 includes a heater for thermal conductive bonding of the electrical contact pads of the LEDs 100 to the target substrate 560 subsequent to placement of the LEDs 100 on the target substrate 560 by the pickup head 724. In other embodiments, the target substrate 560 is an intermediate carrier substrate that is used to facilitate direct bonding of the LEDs 100 with a separate target substrate 560 (e.g., using a direct bonding process).

In some embodiments, the system 700 includes multiple pickup head arrays 704 each positioned at a separate station. Each station may be dedicated to the pick and place of a particular color LED, such as a green station for green LEDs, a red station for red LEDs, and a blue station for blue LEDs, etc.

The laser source 726 is a device for emitting a light that detaches the native substrate layer 210 from the LEDs. The process of using the laser source 726 to detach the native substrate layer 210 is referred to herein as a laser lift-off (LLO) operation. In some embodiments, the laser source 726 projects a laser light that passes through the native substrate layer 210 and be absorbed by the gallium semiconductor layer of the LEDs 100. For example, the laser source 726 may project a pulse ultraviolet laser that passes through a sapphire substrate layer 210 to be absorbed by the gallium semiconductor layer of the LEDs 100. In other embodiments, where the substrate layer 210 comprises gallium arsenide, the laser source 726 projects an IR laser. Absorption of the laser light projected by the laser source 726 causes a portion of the gallium semiconductor layer to separate into its component elements and weakens the bond between the gallium semiconductor layer of the LEDs 100 and the native substrate 210, allowing for the LEDs 100 and the native substrate 210 to be separated. The laser lift-off actuator 750 may remove the native substrate 210 from the LEDs 100 after the bonding is weakened.

The polymer application tool 754 is a device for depositing an uncured photocurable polymer across top surfaces of the LEDs 100. The light source 710 projects light to cure the photocurable polymer, adhering a pickup head 724 to the LED 100 when the pickup head 724 picks up the LED 100 from the temporary substrate 220.

In some embodiments, the laser source 726, instead of being configured to project a laser through the native substrate 210, projects the laser at a junction of the native substrate 210 and the gallium semiconductor layer of the LEDs 100. As such, the projected laser may not need to pass through the native substrate 210. In these embodiments, the native substrate 210 may comprise a material not substantially transparent to the laser projected by the laser source 726.

In some embodiments, another laser (not shown) generates a laser light to singulate the LEDs 100 on the temporary substrate 220. Multiple LEDs 100 may be fabricated on the native substrate 210 and singulated on the temporary substrate 220. In some embodiments, the laser light is directed through the temporary substrate 220. The temporary substrate may include a carrier tape or other adhesive layer to hold the LEDs 100 in place with an adhesion force. In some embodiments, the laser light reduces the adhesion force to facilitate pick up of the LEDs 100 by the pickup head array 704. In some embodiments, the system 700 includes a mechanical dicer to singulate the LEDs 100, such as a diamond based cutting wheel.

In some embodiments, the controller 706, in addition to controlling an alignment of the pickup heads 724 of the pickup head array 704 (e.g., using actuators 722), may also control a temperature of the environment 702. In some embodiments, the controller 706 may alter the temperature of the environment 702 to change a temperature of the LEDs 100. For example, the controller 706 may operate one or more heating coils (not shown) in the environment 702 to raise a temperature of the LEDs 100. In other embodiments, the carrier stage 310 or other component may contain a heater able to directly heat one or more of the LEDs 100. In some embodiments, the temperature of the environment 702 is controlled using a separate temperature controller (not shown).

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
depositing a photocurable polymer across top surfaces of a set of light emitting diodes (LEDs) mounted on a temporary substrate;
placing a pickup head on a top surface of a subset of the LEDs with the photocurable polymer between the pickup head and the top surface of the subset of the LEDs;
curing a portion of the photocurable polymer between the pickup head and the subset of the LEDs by directing light through the pickup head; and
removing the subset of the LEDs away from the temporary substrate by causing relative movement between the temporary substrate and the pickup head attached with the subset of LEDs through the cured photocurable polymer.

2. The method of claim 1, wherein removing the subset of the LEDs away from the temporary substrate further comprises:
decomposing the cured portion of the photocurable polymer;
placing the subset of LEDs on a target substrate; and
releasing the subset of LEDs on the target substrate.

3. The method of claim 2, wherein decomposing the cured portion of the photocurable polymer comprises:
    thermally decomposing the cured portion of the photocurable polymer.

4. The method of claim 2, wherein decomposing the cured portion of the photocurable polymer further comprises:
    decomposing the cured portion of the photocurable polymer by wet etching.

5. The method of claim 1, wherein the pickup head is used to remove a plurality of subsets of LEDs away from the temporary substrate.

6. The method of claim 1, wherein the pickup head is made of material that is optically translucent or transparent.

7. The method of claim 6, wherein the pickup head is made of material that has a coefficient of thermal expansion (CTE) close to a CTE of the LEDs.

8. The method of claim 7, wherein the pickup head is made of fused silica.

9. The method of claim 1, further comprising:
    removing a portion of the polymer by radio frequency (RF) plasma etching.

10. The method of claim 1, wherein a feature size of each of the LEDs is from 0.1 μm to 10 μm.

\* \* \* \* \*